United States Patent

Hayamizu et al.

[11] Patent Number: 5,512,151
[45] Date of Patent: Apr. 30, 1996

[54] METHOD OF MAKING THIN-LAYER COMPONENT

[75] Inventors: Shunichi Hayamizu, Amagasaki; Tomoko Miyaura, Habikino; Noboru Saeki, Osaka, all of Japan

[73] Assignee: Minolta Camera Kabushiki Kaisha, Osaka, Japan

[21] Appl. No.: 255,886

[22] Filed: Jun. 7, 1994

Related U.S. Application Data

[62] Division of Ser. No. 36,689, Mar. 25, 1993, abandoned.

[30] Foreign Application Priority Data

Sep. 25, 1992 [JP] Japan .................................. 4-256795

[51] Int. Cl.$^6$ ..................................................... C23C 14/34
[52] U.S. Cl. ........................... 204/192.15; 204/192.12; 204/298.06; 204/298.11
[58] Field of Search .................... 204/192.12, 192.15, 204/298.06, 298.11

[56] References Cited

U.S. PATENT DOCUMENTS

| | | | |
|---|---|---|---|
| 3,361,659 | 1/1968 | Bertelsen | 204/192.2 |
| 3,526,584 | 9/1970 | Shaw | 204/192.22 |
| 3,528,902 | 9/1970 | Wasa et al. | 204/192.12 |
| 3,528,906 | 9/1970 | Cash, Jr. et al. | 204/298.06 |
| 3,562,142 | 2/1971 | Lamont, Jr. | 204/298.06 |
| 3,654,110 | 4/1972 | Kraus | 204/192.12 |
| 3,897,325 | 7/1975 | Aoshima et al. | 204/298.06 |
| 4,717,462 | 1/1988 | Homma et al. | 204/298.06 |
| 4,824,544 | 4/1989 | Mikalesen et al. | 204/298.06 |

FOREIGN PATENT DOCUMENTS

| | | | |
|---|---|---|---|
| 3-46990 | 7/1991 | Japan . | |
| 4-05874 | 1/1992 | Japan | 257/295 |

OTHER PUBLICATIONS

"Pyroelectric Linear Array Infrared Sensors Made of c–axis–oriented La–modified $PbTiO_3$ Thin Films", J. Appl. Phys., vol. 63, No. 12, Jun. 15, 1988, pp. 5868–5872.

"Preparation and Switching Kinetics of $Pb(Zr, Ti)_3$ Thin Films Deposited by Reactive Sputtering", Japanese J. Appl. Phys., vol. 30, No. 9B, Sep. 1991, pp. 2159–2162.

"Oxygen Induced Preferred Orientation of dc Sputtered Platinum", J. Vac. Scl. Technol., vol. 18, No. 2, Mar. 1981, pp. 219–222.

Primary Examiner—Aaron Weisstuch
Attorney, Agent, or Firm—Burns, Doane, Swecker & Mathis

[57] ABSTRACT

The present invention relates to a thin-layer component having a thin layer of (100)-oriented platinum or the other metals in Group VIII, which is formed on amorphous silicon dioxide, and further relates to a thin-layer producing system for producing such thin-layer components, the thin-layer producing system being a sputtering system wherein an auxiliary electrode is provided between two electrodes.

9 Claims, 4 Drawing Sheets

METHOD OF MAKING THIN-LAYER COMPONENT

This application is a divisional, of application Ser. No. 08/036,689, filed Mar. 25, 1993, now abandoned.

BACKGROUND OF THE INVENTION

1. Field of the Invention

The present invention relates to a thin-layer component composed of a thin layer of platinum or the like formed on amorphous silicon dioxide. More particularly, the invention relates to a thin-layer component composed of a thin layer of (100)-oriented platinum (Pt) or the like, which is useful in fabricating pyroelectric infrared sensors having a photosensitive layer formed of lead titanate or the like that is a ferroelectric substance. The present invention further relates to a system for producing the thin-layer component.

2. Description of the Prior Art

Pyroelectric infrared sensors, the sensitivities of which do not depend on wavelengths, are capable of operating at room temperature. They show high sensitivities even in the long-wave band so as to be useful in detection of substances at around room temperature. Thus, they are used in various fields such as industrial robots, temperature control, environmental monitoring, crime prevention, infrared cameras, or pixels in VCRs.

As the material of the pyroelectric infrared sensors, there have conventionally been used perovskite type ferroelectric thin layers that will vary in the degree of spontaneous polarization with change in temperature, particularly lead titanate ($PbTiO_3$) by virtue of its capability of being formed into thin layers. The crystal of lead titanate is of the tetragonal system and its spontaneous polarization is oriented in the direction of the c-axis. For this reason, when the c-axis is oriented perpendicular to the substrate (c-axis orientation), any change in this spontaneous polarization can be picked up as a signal at a possible maximum level. Thus, lead titanate, when functionally applied to a pyroelectric infrared sensor, can provide such a sensor having high sensitivity.

Generally, when thin layers are formed, it is important to properly select the substrate that serves as the base. The crystal of lead titanate has a lattice constant in the a-axis direction of 3.90 Å, and platinum (face-centered cubic crystal), which has a lattice constant of 3.92 Å, is used as a substrate having an approximately equal value of lattice constant to the foregoing. If a thin layer of (100)-oriented platinum is used as a substrate and lead titanate is deposited thereon by sputtering, c-axis orientation can be rather easily achieved by virtue of its lattice matching.

Normally, platinum thin layers are formed by sputtering. The sputtering is generally implemented in the following manner: a RF or DC high voltage is applied between a target and a substrate within a vacuum chamber in which a sputter gas, such as argon gas, has been introduced, so as to generate plasma between the substrate and the target. Argon ions are generated in the plasma and are thrown into accelerated collision against the target to thereby sputter away particles of the target with the result of deposition of the latter on the substrate. Thus a thin layer is formed.

When a platinum thin-layer is formed on a (100) oriented magnesium oxide layer, the (100) orientation could be preferentially given by effecting the DC magnetron sputtering technique in the presence of a slight quantity of oxygen. Therefore, an infrared sensor incorporating lead titanate as its photosensitive material has conventionally been provided, in its basic structure, by a pyroelectric infrared sensor in which a thin layer (2) of (100)-oriented Pt is formed on a (100)-oriented magnesium oxide (MgO) substrate (3) as shown in FIG. 1(A), the thin layer being assumed to be a lower electrode, and further a c-axis oriented layer (1) of lead titanate is formed on the thin layer (2).

Meanwhile, in recent years there has been an increasing demand that sensors in the whole range including pyroelectric infrared sensors be given the ability to serve additional needs in various fields such as industrial robots, temperature control, environmental monitoring, crime prevention, infrared cameras or pixels in VCRs. To meet this demand, it is necessary to integrate a sensor portion and an IC portion together. The IC portion, normally, is provided in such a structure that the surface of the silicon substrate is protected with an amorphous layer of silicon dioxide. Thus, to fabricate a laminate-type sensor in which the sensor portion and the IC portion are integrated, it is required to form a lead titanate layer on the amorphous silicon dioxide monolithically (layer-laminated type).

Hitherto, there have been proposed various arrangements for fabricating the lead titanate layer (1) on amorphous silicon dioxide: one in which, as shown in FIG. 1(B), a (100)-oriented magnesium oxide layer (3) is formed on silicon dioxide layer (4) and further thereon a platinum layer (2) is formed by sputtering, or another in which, as shown in FIG. 1(C), a platinum layer (2) is formed on silicon dioxide (4) directly by sputtering and further thereon a lead titanate layer (1) is formed. The substrate layer (5) is under the silicon dioxide layer (4).

The sensor as shown in FIG. (B) is not preferred because magnesium oxide layer (3), if interposed between the layer (2) and the silicon dioxide layer (4) as shown in FIG. 1(B), would cause thermal load, decrease of output and deterioration of sensitivity. The substrate layer (5) is under the silicon dioxide layer (4).

When a metal layer having a crystalline structure of face-centered cubic crystal such as platinum, is formed on an amorphous substrate such as silicon dioxide, the resulting thin layer tends to take a (111)-orientation where its surface free energy becomes minimum (FIG. 1(C)). If a lead titanate layer was formed on such a (111)-oriented platinum layer, it would be difficult for lead titanate to take the c-axis orientation on account of its lattice matching. As far as the conventional sputtering technique is concerned, a platinum thin layer (2) formed on a sputtered amorphous silicon dioxide would result in (111)-orientation in most cases, so that preferentially c-axis-oriented lead titanate layers and the like could not be formed on silicon monolithically.

SUMMARY OF THE INVENTION

The object of the present invention is to provide a thin-layer component comprised of a thin layer of (100)-oriented platinum or the other metals in Group VIII and further to provide a thin-layer producing system capable of fabricating such thin-layer components.

The present invention relates to a thin-layer component having a thin-layer of (100)-oriented platinum or the other metals in group VIII formed on amorphous silicon dioxide.

The present invention further relates to a thin-layer producing system for generating plasma between a target and a substrate used as electrodes in order to deposit particles of the target onto the substrate, characterized in that an auxiliary electrode is provided between the two electrodes.

DETAILED DESCRIPTION OF THE INVENTION

The present invention provides a thin-layer component having a thin layer of (100)-oriented platinum or the like formed on amorphous silicon dioxide.

Use of the thin-layer component of the present invention will allow the formation of a photosensitive layer composed of a ferroelectric material such as c-axis-oriented lead titanate on a silicon semiconductor whose outermost surface is covered with amorphous silicon dioxide, thus making it possible to produce high-performance pyroelectric infrared sensors and the like in which a sensor has been integrated on an IC monolithically. Such thin layers of (100)-oriented platinum and the like on amorphous silicon dioxide, which have been unavailable hitherto, can be produced by using a thin-layer producing system of the present invention.

Accordingly, the present invention relates to a thin-layer component having a thin layer of (100)-oriented platinum or metals in Group VIII formed on amorphous silicon dioxide, and further relates to a thin-layer producing system for forming such thin layers.

Figure 1A:
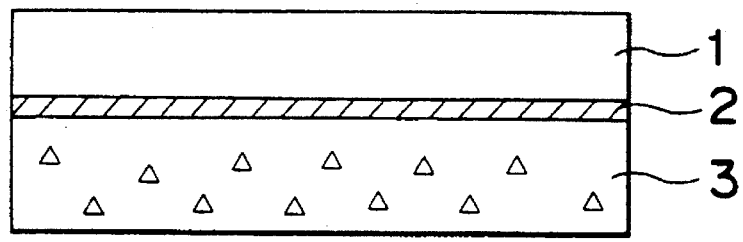
FIG. 1(A) is a schematic sectional view of one example of the conventional pyroelectric infrared sensors.
Figure 1B:
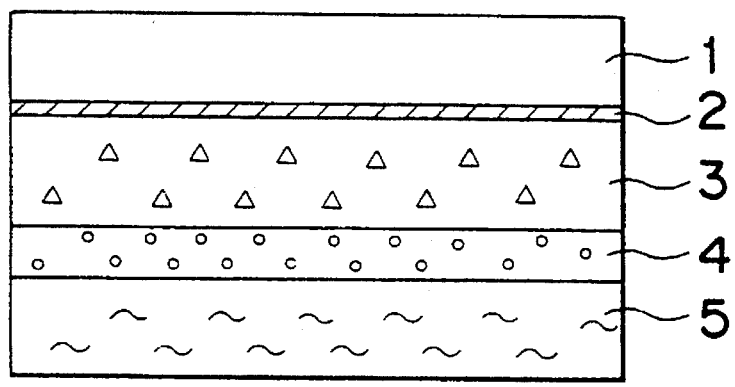
FIG. 1(B) is a schematic sectional view of another example of the conventional pyroelectric infrared sensors.
Figure 1C:
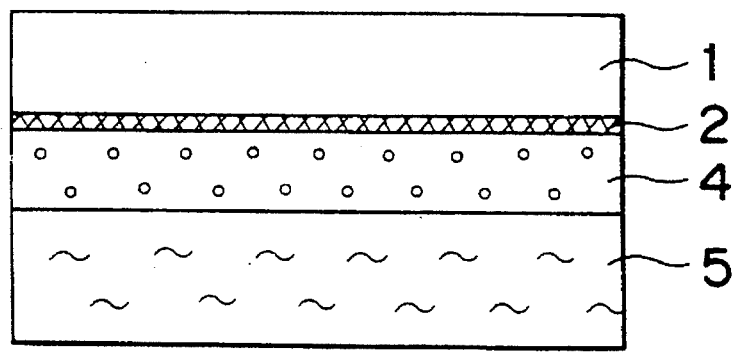
FIG. 1(C) is a schematic sectional view of yet another example of the conventional pyroelectric infrared sensors.
Figure 2:
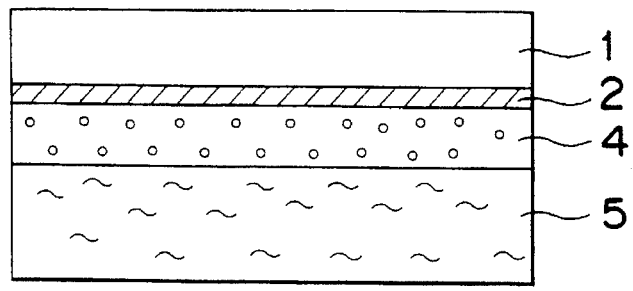
FIG. 2 is a schematic sectional view of an example of a pyroelectric infrared sensor incorporating a thin-layer component according to the present invention.

More specifically, the present invention, as shown in FIG. 2 as an example, is constituted of a silicon substrate (5), a thin layer of (100)-oriented platinum or metals in Group VIII formed on an amorphous silicon dioxide layer (4). Use of the (100)-oriented platinum or the like of the present invention as a base will make it possible to form a thin layer of c-axis-oriented lead titanate (1) even by the conventional techniques, so that a c-axis-oriented lead titanate layer can be formed on a silicon wafer.

The amorphous silicon dioxide layer (4) is ordinarily used as a protective layer for the IC formed on the silicon substrate. On this amorphous silicon dioxide layer (including the wafer), according to the present invention, there is provided a thin layer of (100)-oriented platinum or other metals in Group VIII (e.g. palladium). The orientation herein is referred to as the one determined by analysis by the powder method of X-ray diffraction.

In order to be (100)-oriented it is necessary to meet the condition that the orienting ratio $\alpha$ defined as:

$$\alpha = I(200)/\{I(200)+I(111)\}$$

should show a value of not less than 0.5, preferably not less than 0.95, and more preferably not less than 0.98, where $I(200)$ and $I(111)$ represent the X-ray diffraction intensities from (200) and (111) planes, respectively, that have been standardized with powder samples.

The thickness of the thin-layer of (100)-oriented platinum or the like of the present invention is not limitative but preferably is as small as possible in terms of thermal capacity when applied to, for example, a pyroelectric infrared sensor, the thickness being normally 100 to 300 nm. On this thin-layer, an infrared photosensitive material layer (1), which is formed of a ferroelectric substance such as lead titanate, is formed by a conventional technique such as the reactive ionized cluster beam technique or the RF magnetron sputtering technique.

When the lead titanate layer is formed on a platinum thin-layer, the c-axis-oriented ratio of lead titanate increases with the (100)-oriented ratio of platinum thin layer. Since the thin-layer component of the invention is composed of a thin layer of (100)-oriented platinum or the like, the lead titanate is preferentially oriented on the thin-layer electrode in the direction of the c-axis, so that an infrared sensor with requisite sensitivity can be obtained.

The thin-layer component of the present invention may include thin layers of (100)-oriented platinum and other metals in Group VIII such as nickel (Ni) or palladium (Pd), the thin layers being deposited on amorphous silicon dioxide. In the present invention, platinum was used in view of lattice matching and chemical stability in the embodiments of the invention described hereinafter. Palladium is less expensive than platinum and has a lattice constant of 3.89, very close to the a-axis lattice constant of lead titanate, and hence is promising as the substrate of the lead titanate ferroelectric layer.

In fabricating a pyroelectric infrared sensor by using a thin-layer component of the present invention, it is possible to use a ferroelectric substance of perovskite type other than lead titanate, for example, PZT, PLT, or other ferroelectric substances.

Figure 3:
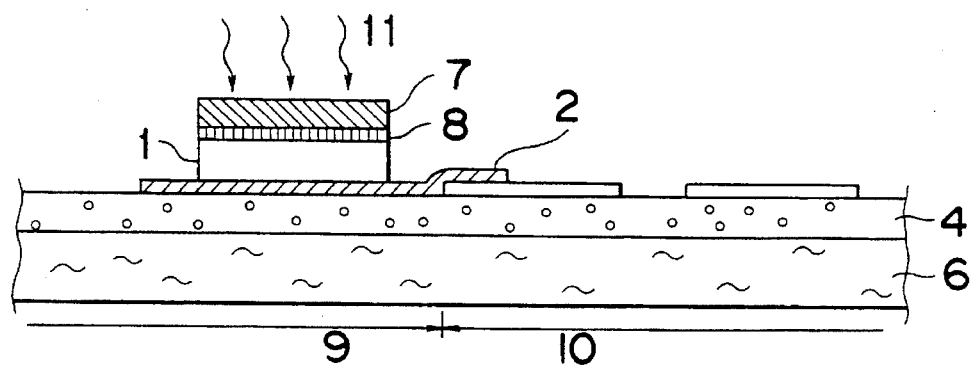
FIG. 3 is a schematic sectional view of a CCD-integrated pyroelectric infrared sensor incorporating a thin-layer component according to the invention.

The thin-layer component of the present invention may be applied extensively to IC-integrated infrared sensors and others whose arrangement is such that a (100)-oriented thin layer (2) is formed on the amorphous silicon dioxide layer (4) on the IC formed on the silicon substrate (5), the thin-layer component serving as the lower electrode of the sensor. Thus, it is made feasible to provide such a sensor having the ability to serve the additional needs in the various fields described above. More specifically, as shown in FIG. 3, the platinum thin-layer (2) of the invention is laminated on, for example, a CCD (Charge Coupled Device) constituted of the silicon wafer (6) formed according to the IC processes. A ferroelectric material layer (1) and other materials are further laminated thereon so as to serve as the light-receiving portion sensor portion) of the CCD. Still further, the receiving portion is combined with the transfer portion and integrated therewith. By this arrangement, it becomes possible to handle an electrical signal sent from the infrared sensor, allowing the formation of a thermal image. Since the infrared sensor incorporating the component of the present invention is of a layer-laminated type, it becomes also possible to provide a further fine-structured, small-sized, high-integrated sensor by applying photolithography techniques.

Normally, the infrared sensor is arranged such that an upper electrode and an infrared-absorbing layer are formed on the ferroelectric layer. The upper electrode commonly may be formed of At, Pt, NiCr, and the like. The infrared-absorbing layer may be formed of NiCr, platinum black, and the like according to usual process.

The perovskite-type ferroelectric substance such as lead titanate is receiving attention also as a nonvolatile memory. A nonvolatile memory is a device taking advantage of the hysteresis of polarization of a ferroelectric substance (VE hysteresis). In more detail, the nonvolatile memory can write therein "1" or "0" depending on the difference in the direction of polarization that is invertible therein, taking advantage of the property that its remanence will be retained even if the electric field becomes zero, once a high voltage is applied to the ferroelectric substance. Also when functionalized as such a memory, c-axis-oriented lead titanate can make maximum use of its polarization, with increased amount of signal as a memory. Further, remanence due to increase in the number of inversions of polarization is lessened. This helps the device resist fatigue and prolong its service life.

The thin-layer component of the present invention may be applied also as the base electrode of a device incorporating these polarization effects. Use of the thin-layer component of the invention allows lead titanate, which can be utilized as a nonvolatile memory, to be formed thereon in the c-axis orientation. Thus, the nonvolatile memory of the IC can be enhanced in performance.

Figure 4:
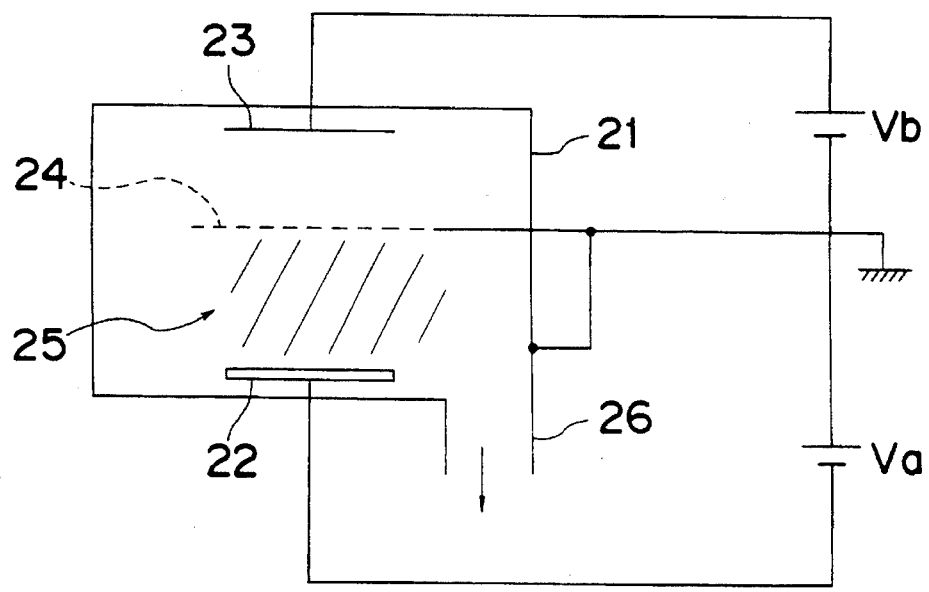
FIG. 4 is a schematic structural view of an example of a thin-layer producing system according to the invention.

The thin-layer component of (100)-oriented platinum or other metals in Group VIII formed on amorphous silicon dioxide may be formed by sputtering if a thin-layer producing system according to the present invention is used. An example of the thin-layer producing system of the invention is shown in FIG. 4. The thin-layer producing system according to the present invention is a sputtering system in which a voltage is applied between a target (22) and a substrate (23), both of which are used as electrodes and provided within a conventional vacuum chamber (21) having an exhaust outlet (26) to thereby generate plasma, so that particles are sputtered from the target and deposited on the substrate, the thin-layer producing system further comprising an auxiliary electrode (24) provided between the substrate and the target, whereby electric fields can be formed independently between the substrate and the auxiliary electrode and between the target, and the auxiliary electrode.

By the provision of the auxiliary electrode, plasma is generated in a plasma region (25) between the target (22) and the auxiliary electrode (24), and the layer growth is effected with the help of the electric field between the substrate (23) and the auxiliary electrode (24). When argon gas is used as sputter gas, the accelerated argon ions collide with the target to sputter particles. The sputtered particles pass through the auxiliary electrode (24) and deposit on the substrate (23) with the aid of the electric field applied between the substrate (23) and the auxiliary electrode (24). Since the voltage (Vb) between substrate and auxiliary electrode can be set independently, the degree of freedom of the conditions for layer formation is increased, making it feasible to form a layer having a special crystallinity and orientation, which has been impractical heretofore, by optimizing the conditions of the electric field between substrate and auxiliary electrode. Meanwhile, the plasma of argon ions or the like is obstructed by the auxiliary electrode (24), so as to be unable to reach the substrate side, thus reducing plasma damage to the deposited layer surface, which has often been a problem with the ordinary sputtering system.

The material and shape of the auxiliary electrode are not limitative, but only required to be electrically conductive and have such a structure as can allow particles sputtered from the target to pass therethrough, for example, in a mesh-, doughnut-, or spiral-shaped structure having clearances or holes that allow the particles to pass therethrough. It may be selected depending on the conditions such as the type and size of the substrate and target, the type of sputter gas, partial pressure, temperature in the bath. However, with a view to producing a uniform thin layer, the structure is preferably such that the electric fields between the target and the auxiliary electrode and between the substrate and the auxiliary electrode can be applied perpendicularly to the target. Although the auxiliary electrode is shown as grounded in FIG. 4, which is only an example, it need not necessarily be grounded. Any structure that allows each electric field between the target and the auxiliary electrode and between the substrate and the auxiliary electrode to be formed independently may be properly adopted.

In the present invention, it is preferable to introduce oxygen (gas). By so doing, the ratio of the (100)-oriented crystals can be increased, and thin layers adhered well to the substrate can be obtained. The amount of $O_2$ introduced is $2\times10^{-4}$ Torr or more, preferably $4\times10^{-4}$ to $1\times10^{-3}$ Torr, in partial pressure. If the amount is below $1\times10^{-4}$ Torr, it is likely that the ratio of (100)-orientation is decreased while the ratio of (111)-orientation is increased.

The other conditions for sputtering, such as the direction and strength of the electric field between the substrate and the auxiliary electrode, temperature of the substrate, temperature of the vacuum chamber, and sputter gas, may be selected depending on circumstances, and the optimization of these conditions will allow the crystallinity to be increased, and the orientation of crystal to be controlled.

The thin-layer producing system of the present invention makes it feasible, with amorphous silicon dioxide used as a substrate, to obtain a thin layer of (100)-oriented platinum adhered well to the substrate. This substrate can appropriately be used as the substrate for lead titanate, similarly to the (100)-oriented magnesium oxide substrate.

According to the thin-layer producing system of the present invention, it is possible to form an orientation-controlled thin layer on an amorphous silicon dioxide substrate by using not only platinum but also some other metals. For example, it is possible to form a (100)-oriented layer of a metal in Group VIII other than platinum, such as nickel or palladium. Also, depending on the control of the sputtering conditions, the thin-layer producing system of the present invention can be applied to the formation of an orientation-controlled thin layer on a substrate other than that of amorphous silicon dioxide, for example, substrates of polymer such as polyimide, or those made of other various materials.

DETAILED DESCRIPTION OF THE PREFERRED EMBODIMENTS

The present invention will now be described in more detail with reference to embodiments thereof.

A system as shown in FIG. 4 was prepared. This is a modification of an ordinary sputtering system in which the auxiliary electrode (24) is further provided. Platinum was used for the target (22) and amorphous silicon dioxide formed on silicon was used for the substrate (23). A stainless mesh was used as the auxiliary electrode (24), which was grounded to serve as a zero-potential shield electrode. In this embodiment, the shield electrode (24) is provided in an argon atmosphere containing oxygen so that the region in which plasma exists is restricted and that the argon and oxygen ions can be prevented from invading into the substrate site. In this way a layer of (100)-oriented platinum was formed on the amorphous silicon dioxide substrate. The conditions under which the sputtering was effected in this case are shown in Table 1.

TABLE 1

Conditions for layer formation

| | |
|---|---|
| Substrate temperature | 100–300° C. |
| Total pressure (Ar) | $5 \times 10^{-2} - 2 \times 10^{-1}$ torr |
| $O_2$ partial pressure | $2 \times 10^{-4} - 1 \times 10^{-3}$ torr |
| Target power·Va | 400 V 225 mA |
| Shield (auxiliary) electrode potential | Ground |
| bias voltage Vb to substrate | 60–200 V (positive potential to shield electrode) |
| Rate of layer formation | 300 Å/min. |

Figure 5:
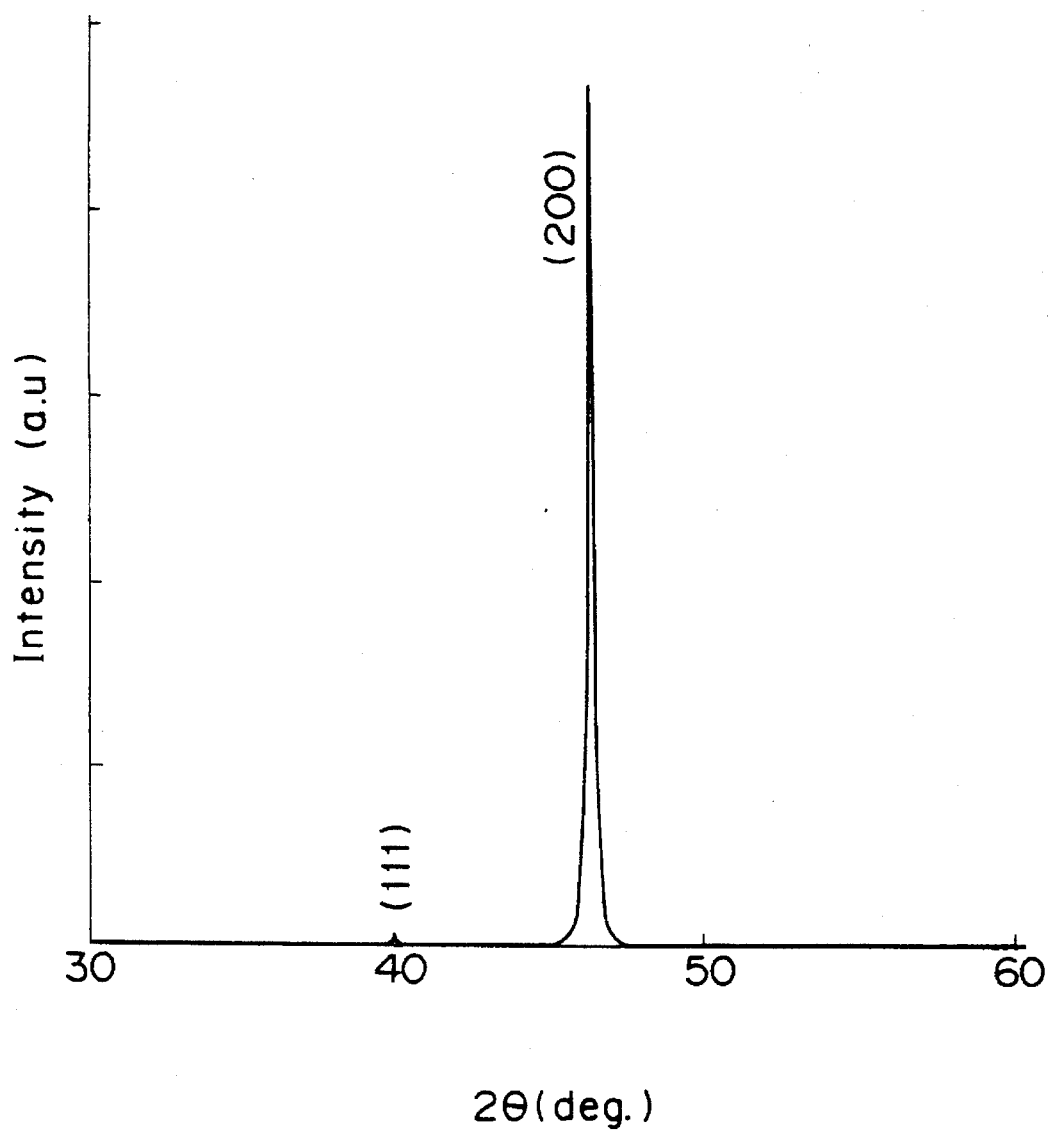
FIG. 5 is a chart of the X-ray diffraction of a thin layer of (100)-oriented platinum according to the invention.

The X-ray diffraction pattern of the platinum thin layer obtained under the above conditions is shown in FIG. 5. The (100)-oriented ratio α of platinum was calculated from the peak intensity in FIG. 5. When a platinum thin layer was formed on amorphous silicon dioxide by the method of the present invention, a platinum thin layer having α larger than 0.98 was obtained. Depending on the combination of conditions, it was possible to form a thin layer of (100)-oriented platinum on an amorphous silicon layer even under different conditions from those shown in Table 1. A comparison between the platinum thin-layer obtained in the present embodiment and a platinum thin-layer obtained by the conventional technique is shown in Table 2.

TABLE 2

Comparison of electrodes between the prior-art and the present invention

| | | Prior art | | | Invention |
|---|---|---|---|---|---|
| Condition for layer formation | Substrate | MgO | Amorphous $SiO_2$ | | |
| | Auxiliary electrode | No | No | No | Present |
| | $O_2$ atmosphere | Present | Present | No | Present |
| Evaluation of thin layer | (100) preferential orientation | ○ | x | x | ○ |
| | Adhesion to substrate | Good | Good | Poor | Good |

A thin layer of (100)-oriented platinum adhered well to amorphous silicon dioxide thus could be produced by using the system of the invention.

Further, plural thin layers having various (100)-oriented ratios (α) were produced on an amorphous silicon dioxide substrate, and further thereon a thin layer of lead titanate was formed by the ionized cluster beam deposition method. Then their c-axis-oriented ratios were determined by the X-ray diffraction method. The c-axis-oriented ratio β was defined as:

$$\beta = I(001)/\{I(001) + I(101)\}$$

by using X-ray diffraction intensity from the (001) and (101) planes of the lead titanate thin layers. The correlation of the c-axis-oriented β of lead titanate vs. the (100)-oriented α of platinum is shown in FIG. 6.

Figure 6:
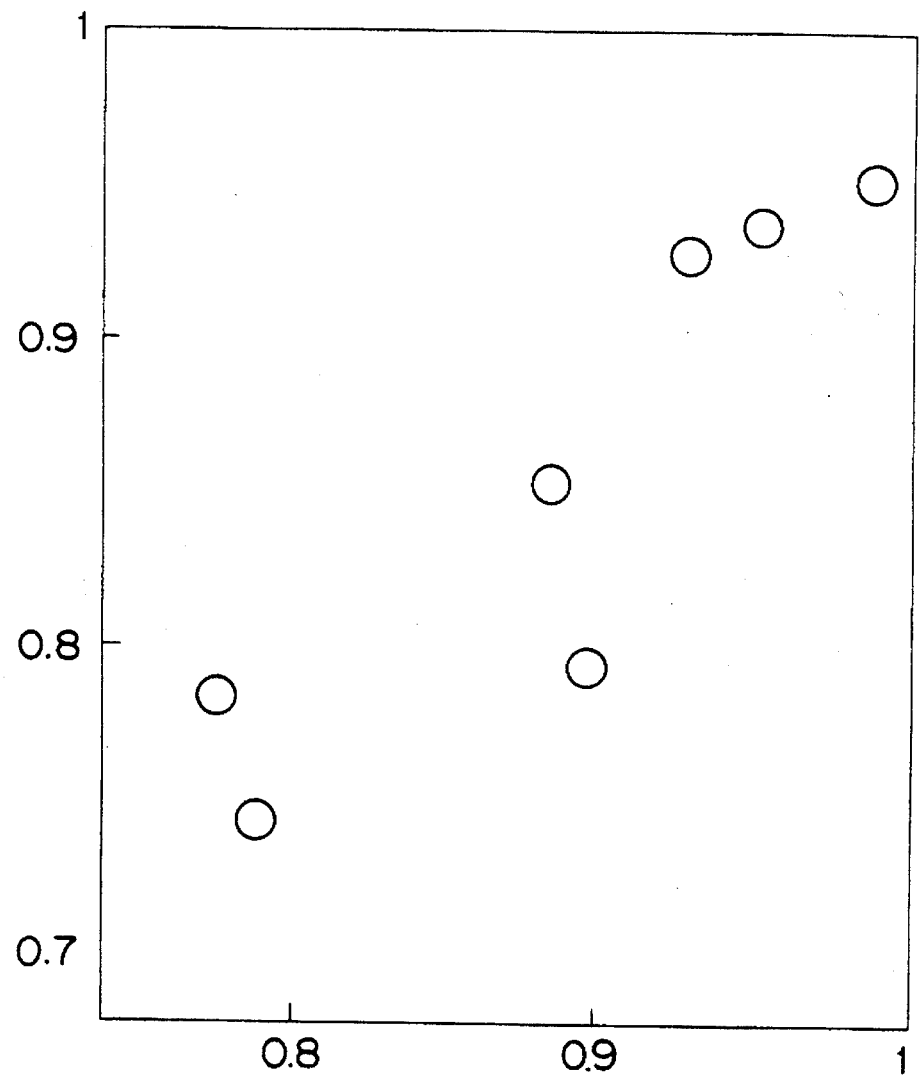
FIG. 6 shows the relationship of the (100)-oriented ratio of platinum vs. c-axis-oriented ratio of lead titanate.

As apparent from FIG. 6, the greater the (100)-oriented ratio of thin layers of platinum, the greater is the c-axis-oriented ratio of thin layers of lead titanate formed thereon. For example, in the case of a substrate of a thin layer of platinum with α>0.95, a thin layer of lead titanate with β>0.95 was obtained.

What is claimed is:

1. A method for producing a thin layer component (100)-oriented platinum in a vacuum chamber which has a target as a first electrode and an auxiliary electrode providing spaces through which particles sputtered out of the target can pass, comprising:

setting a substrate as a second electrode in a manner such that the auxiliary electrode is arranged between the target and the substrate;

introducing an argon and oxygen gas mixture into the vacuum chamber; and forming an electric field between the auxiliary electrode and the target independently of an electric field formed between the auxiliary electrode and the substrate, such that plasma is generated only between the auxiliary electrode and the target.

2. The method of claim 1, further comprising:

adjusting the electric field between the auxiliary electrode and the substrate to control conditions for layer formation.

3. The method of claim 1, further comprising:

sputtering the particles out of the target; and depositing the sputtered particles, which pass through the spaces on the auxiliary electrode, on the substrate.

4. The method of claim 3, wherein the sputtering step includes the following step:

colliding argon ions, accelerated by the plasma, with the target to sputter the particles.

5. The method of claim 1, wherein the substrate is an amorphous silicon dioxide layer formed on a silicon wafer, and wherein the thin layer of (100)-oriented platinum is deposited on the amorphous silicon dioxide layer.

6. The method of claim 1, wherein the substrate temperature is maintained from about 100° C. to 300° C.

7. The method of claim 1, wherein the auxiliary electrode is grounded, and wherein a bias voltage between 60 and 200 volts is applied to the substrate.

8. The method of claim 1, wherein a total pressure of the argon and oxygen gas mixtures is maintained between $5 \times 10^{-2}$ and $2 \times 10^{-1}$ Torr.

9. The method of claim 1, wherein the partial pressure of oxygen gas is maintained between $2 \times 10^{-4}$ and $1 \times 10^{-3}$ Torr.

* * * * *